United States Patent [19]

Sawaki et al.

[11] Patent Number: 5,380,410
[45] Date of Patent: Jan. 10, 1995

[54] PROCESS FOR FABRICATING AN OPTICAL DEVICE FOR GENERATING A SECOND HARMONIC OPTICAL BEAM

[75] Inventors: Ippei Sawaki; Sunao Kurimura; Michio Miura, all of Kawasaki, Japan

[73] Assignee: Fujitsu Limited, Kawasaki, Japan

[21] Appl. No.: 189,997

[22] Filed: Feb. 1, 1994

Related U.S. Application Data

[63] Continuation of Ser. No. 934,233, Aug. 25, 1992, abandoned.

[30] Foreign Application Priority Data

Sep. 18, 1991 [JP] Japan .................................. 3-236731
Mar. 16, 1992 [JP] Japan .................................. 4-058352

[51] Int. Cl.$^6$ .................................................. C25F 5/00
[52] U.S. Cl. ...................................... 204/130; 204/140
[58] Field of Search ................................ 204/130, 140

[56] References Cited

U.S. PATENT DOCUMENTS

| | | | |
|---|---|---|---|
| 3,531,779 | 9/1970 | Hopkins et al. | 340/173 |
| 3,826,348 | 9/1974 | Summimoto et al. | 204/130 |
| 3,836,348 | 9/1974 | Sumimoto et al. | 204/130 |
| 3,899,697 | 8/1975 | Cummins | 310/8 |
| 4,057,660 | 11/1977 | Yoshida et al. | 427/100 |
| 4,236,785 | 12/1980 | Papuchon et al. | 350/96 |
| 4,886,587 | 12/1989 | Miyawaki | 204/130 |
| 5,118,923 | 6/1992 | Farina | 250/205 |

FOREIGN PATENT DOCUMENTS

| | | |
|---|---|---|
| 0409104A3 | 7/1990 | European Pat. Off. . |
| 0466191A3 | 12/1991 | European Pat. Off. . |
| 55-150286 | 11/1979 | Japan . |
| 70541 | 4/1986 | Japan . |
| 187735 | 7/1990 | Japan . |
| 2-187735 | 7/1990 | Japan . |
| 4-19719 | 1/1992 | Japan . |
| WO90/09094 | 8/1990 | WIPO . |

OTHER PUBLICATIONS

Ballman et al., "Ferroelectric domain reversal in lithium metatantalate", 1972, Ferroelectrics, vol. 4, pp. 189–194.

Haycock et al., "A method of polling LiNbO$_3$ and LiTaO$_3$ below T$_c$", Jan. 20, 1986, Univ. of Sussex, School of Mathematical and Physical Sciences, Brighton, UK, pp. 698–700.

Stevenage H., "Fabrication of periodic domain grating in LiNbO$_3$, by electron beam writing and application of nonlinear optical processes", Electronics Letters, 8030, Jul. 4, 1991.

Nakumara et al., "Ferroelectric inversion layers formed by heat treatment of proton-exchanged LiTaO$_3$," Applied Physics Letters, vol. 56, No. 15, Apr. 16, 1990, New York, N.Y., pp. 1535–1536.

Mizuuchi et al., "Blue-light generation by quasi-phase-matched second-harmonic generation in LiTaO$_3$," Conference on Lasers and Electro-Optics, 1991 Technical Digest Series, vol. 10, May 14, 1991, Abstract CTUV3: p. 164.

Nakumara et al., "Ferroelectric inversion layers formed by heat treatment of proton-exchanged LiTaO$_3$," Applied Physics Letters, vol. 56, No. 16, Apr. 16, 1990, New York, N.Y., pp. 1535–1536.

Mizuuchi et al., "Blue-light generation by quasi-phase-matched second-harmonic generation in LiTaO$_3$," Conference on Lasers and Electro-Optics, 1991 Technical Digest Series, vol. 10, May 14, 1991, Abstract CTUV3: p. 164.

*Primary Examiner*—John Niebling
*Assistant Examiner*—Kishor Mayekar
*Attorney, Agent, or Firm*—Staas & Halsey

[57] ABSTRACT

A method for fabricating an SHG device by forming an inversion region having a first direction of polarization selectively in a ferroelectric substrate that has a second, opposite direction of polarization. A proton exchange process exchanges cations in the ferroelectric substrate with protons, selectively in correspondence to each portion of the substrate in which an inversion region is to be formed. Electrodes are provided on upper and lower major surfaces of the ferroelectric substrate, and the inversion region is selectively grown in a direction perpendicular to the upper major surface of the ferroelectric substrate while applying a d.c. voltage to the electrode on the upper major surface of the ferroelectric substrate thereby to induce an electric field acting in a direction coincident with the direction of said first polarization in said ferroelectric substrate.

19 Claims, 15 Drawing Sheets

FIG. IA PRIOR ART
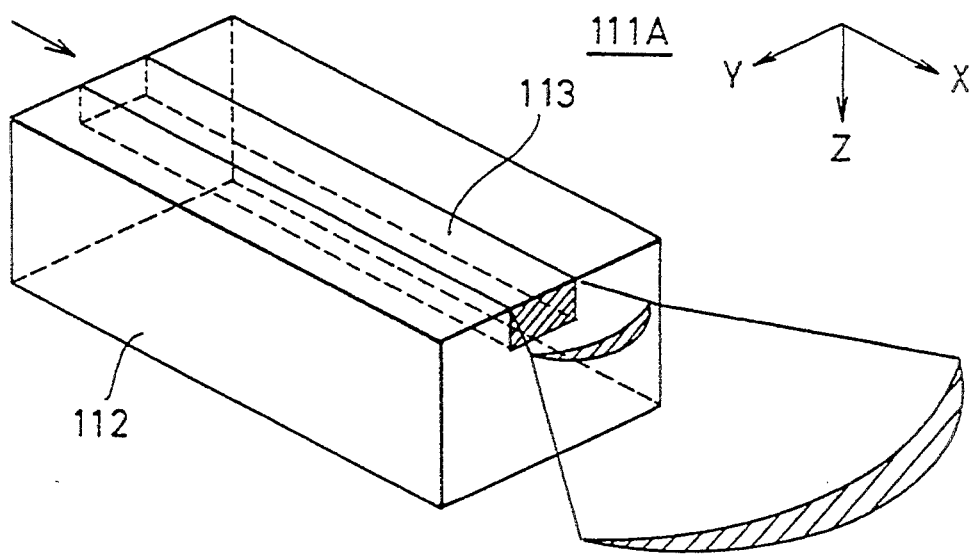
FIG. IB PRIOR ART
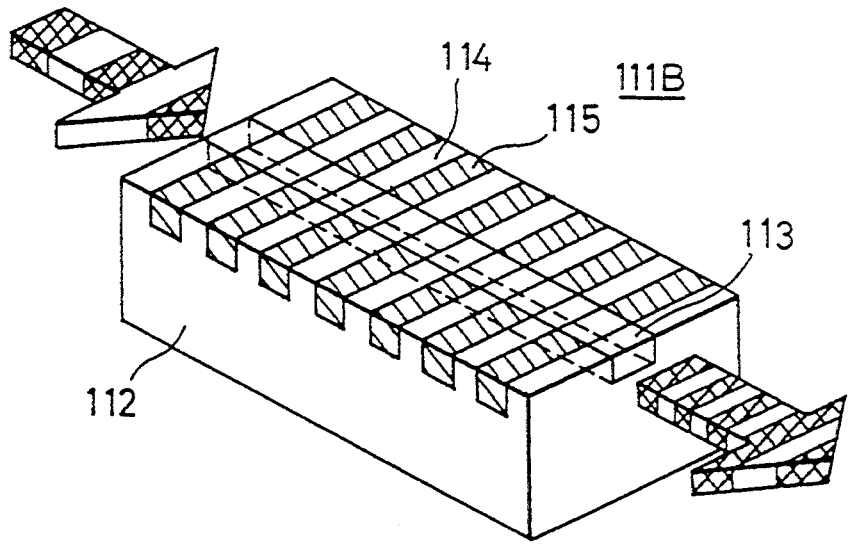

PROCESS FOR FABRICATING AN OPTICAL DEVICE FOR GENERATING A SECOND HARMONIC OPTICAL BEAM

This application is a continuation of application Ser. No. 07/934,233, filed Aug. 25, 1992, now abandoned.

BACKGROUND OF THE INVENTION

The present invention generally relates to fabrication of optical devices and more particularly to a fabrication process of an optical device supplied with an output optical beam from a laser diode for generating a second harmonic optical beam therefrom.

In the wide-spread use of laser diodes in various fields such as laser printers, laser scanners, optical disk devices, etc., there is an increasing demand for an optical beam with a reduced wavelength. Thus, there are intensive efforts for reducing the oscillation wavelength of laser diodes from the conventional infrared region to the visible region for increased storage capacity as well as for easiness in handling the device. On the other hand, there is a limitation in the extent of reduction of oscillation wavelength in the currently available techniques, and attempts are made to use the higher order harmonics of the laser oscillation for the formation of desired short-wavelength output beam.

Conventionally, the bulk crystal of materials that exhibit a non-liner optical property has been used for converting the optical beam of the fundamental mode to the second harmonic beam. Such a device is known as an SHG (second-order harmonic generation) device. Unfortunately, the optical non-linearity that these bulk crystals show is generally limited and the efficiency of conversion is small. Associated therewith, there exists a problem that one needs a large optical output power for the laser diode that drives the SHG device, in order to obtain the desired power for the second-harmonic optical beam.

Meanwhile, there is a proposal to use a ferroelectric material for achieving the desired conversion of wavelength of the optical beam with an improved efficiency of conversion. Generally, the ferroelectric materials exhibit very large non-linear optical constants.

FIG. 1(A) shows a conventional SHG device $111_A$ of so-called Cherenkov radiation type that uses a substrate 112 of a ferroelectric crystal such as $LiNbO_3$, $LiTaO_3$, etc., and an optical waveguide 113 is provided on the surface of the substrate 112. The optical waveguide 113 is formed for example by a modification of the composition of the substrate and has an increased refractive index for confining the optical beam therein. Such a waveguide 113 may be formed by processing the substrate surface by benzoic acid or pyrophosphoric acid for substituting protons for the cations of the ferroelectric material. An input optical beam is injected at an end of the optical waveguide 113 such that the optical beam travels along the optical waveguide 113, and the second harmonic optical beam is formed outside the optical waveguide. In such a device, there exists a problem in that the second order beam has an arc-shape cross section as indicated in the drawing and the optical beam having such an arc-shape cross section is difficult to focus into a small beam spot. Thus, the device of this prior art is not suitable for the applications where a small, sharp optical beam is required as in the case of information processing apparatuses.

FIG. 1(B) shows another conventional device $111_B$ called the QPM (quasi-phase matching) type that also uses a ferroelectric substrate 112 formed with an optical waveguide 113 similarly to the previous device $111_A$, wherein the substrate 112 is polarized in a predetermined direction. In the device $111_B$, it should be noted that there are formed a number of regions 115 with a polarization opposite to the polarization of the substrate 112 along the direction of the optical waveguide 113, and such an inversion region 115 is repeated with a predetermined pitch such that a non-inversion region 114 having the polarization identical with the substrate is interposed between the adjacent regions 115. There, the pitch of the regions 114 and hence the pitch of the regions 115 are set such that the decay of the second-harmonic optical beam due to the refractive index difference between the fundamental mode and the second-harmonic mode in the optical waveguide 113 is compensated for particularly at the wavelength corresponding to the second harmonic mode. By injecting the input optical beam having the fundamental wavelength at an end of the optical waveguide 113, the intensity of the second-harmonic beam increases as the optical beam travels along the waveguide 113. The device $111_B$ has a preferable feature, associated with the fact that the desired second-harmonic optical beam is confined in the optical waveguide 113, in that the distortion of the beam shade is minimum. Thereby, one can obtain a very sharp optical beam by focusing the second-harmonic beam by suitable optical means.

Various efforts are made so far for developing the process for inducing the inversion of polarization in the ferroelectric substrate such that the inversion regions 115 are formed with a controlled pitch. For example, the region 115 may be formed by: (a) diffusing titanium into the $LiNbO_3$ substrate selectively in correspondence to the regions where the desired inversion of polarization is to be induced; (b) removing the Li component from the surface of the $LiNbO_3$ substrate selectively in correspondence to the regions where the inversion of polarization is to be induced: (c) exchanging the $Li^+$ ions in the $LiTaO_3$ substrate with protons in correspondence to the regions where the desired inversion of polarization is to be induced and heating the substrate thus processed; and (d) irradiating the substrate by an electron beam in correspondence to the regions where the desired inversion of polarization is to be induced.

FIGS. 2(A) and 2(B) show the conventional process for causing the inversion of polarization in accordance with the foregoing process (a), wherein a titanium layer 121 is deposited on the surface of a substrate 112a of $LiNbO_3$ by a vacuum deposition process, and the titanium layer 121 thus deposited is patterned as shown in FIG. 2(A) such that the titanium layer remains only in correspondence to the parts on which the regions 115 are to be formed. Next, the structure of FIG. 2(A) is subjected to a heat treatment process at a temperature immediately below the Curie temperature of the substrate (1210° C.) for causing a diffusion of titanium into the substrate as shown in FIG. 2(B). As a result of the diffusion, each inversion regions 115 are formed with a triangular cross section.

FIGS. 3(A) and 3(B) show another conventional process for forming the polarization inversion according to the process (b), wherein a silicon oxide film 122 is provided on the surface of the $LiNbO_3$ substrate 112a by sputtering and patterned subsequently to form the structure of FIG. 3(A). Further, the structure of FIG.

3(A) is held at a temperature immediately below the Curie temperature of the substrate for causing a diffusion of Li into the silicon oxide film 122. Thereby, the composition of the substrate 112a is modified selectively in correspondence to the parts where the diffusion has occurred, and the desired inversion of polarization occurs in correspondence to the regions thus formed with the inversion of polarization.

In any of these conventional processes, there arises a problem, associated with the relatively low threshold of optical damage of the $LiNbO_3$ substrate, in that the substrate as well as the optical waveguide may be damaged by the optical radiation. Further, the depth of the regions 115 formed by the foregoing processes is too small for causing the desired interaction with the input optical beam propagating through the optical waveguide.

With respect to the problem of the optical damage, the $LiTaO_3$ substrate is advantageous because the large threshold of optical damage pertinent to $LiTaO_3$. In addition, the $LiTaO_3$ substrate is advantageous from the view point of forming the regions 115 with a relatively large depth that can reach as much as one quarter of the pitch formed by the regions 115

On the other hand, the optical waveguide 113 that is formed in the $LiTaO_3$ substrate generally has a thickness or depth, measured perpendicularly to the upper major surface of the substrate, of more than 2 μm. The formation of the optical waveguide 113 having a depth smaller than 2 μm is difficult or not desirable because of various reasons. In order to achieve the conversion of the fundamental optical beam to the second-harmonic beam by the interaction with the regions 115 effectively, therefore, it is necessary that each inversion regions 115 extends vertically from the surface to a sufficient depth, larger than about 2 μm and preferably larger than 10 μm.

FIGS. 4(A)–4(C) show the conventional process for forming the polarization inversion regions 115 on the surface of a $LiTaO_3$ substrate 112c according to the foregoing process (c), wherein the surface of the substrate designated as +C represents the lower major surface to which the polarization vector is pointed, while the surface designated as −C represents the upper major surface opposing the +C surface.

Referring to FIG. 4(A), a Z-cut crystal of $LiTaO_3$ is used as the substrate 112c with a polarization formed such that the polarization vector points toward the lower major surface +C of the substrate 112c. In other words, the lower major surface +C of the substrate 112c provides the +C surface while the upper major surface of the substrate provides the −C surface in the illustrated example. Further, the upper major surface, i.e. the −C surface, is polished to the optical grade and a mask layer 123 of Ta is deposited on the −C surface. The mask layer 123 is patterned such that there are formed openings 123a, in correspondence to the inversion regions 115 to be formed to expose the upper major surface of the substrate 112c. As illustrated in FIG. 4(A), each opening 123a has an elongated elongate form extending in the Y-direction or lateral direction of the substrate 112c. Further, the opening 123a is repeated a plurality of times in the X-direction in correspondence to the periodical repetition of the inversion regions 115.

Next, in the step of FIG. 4(B), the substrate of FIG. 4(A) thus masked with the Ta mask 123 is subjected to a proton exchange process. More specifically, the structure of FIG. 4(A) is immersed in a solution of pyrophosphoric acid held at 250° C. for 30 minutes. As a result of the proton exchange process, the $Li^+$ ions in the substrate are exchanged with protons $H^+$ via the openings 123a.

After the step of FIG. 4(B), the structure of FIG. 4(B) is subjected to a heat treatment process at a temperature immediately below the Curie temperature of the substrate 112c (about 590° C.) for causing an inversion of polarization in correspondence to the regions where the proton exchange has occurred, and the inversion regions 115 are formed periodically but with a separation from each other by the non-inversion regions 114 as shown in FIG. 4(C). After the inversion regions 115 are formed, the substrate 112c is formed with an optical waveguide 113 (not shown in FIGS. 4(A)–4(C)) also by the proton exchange process such that the optical waveguide 113 extends in the X-direction, or longitudinal direction, of the substrate 112c.

In the process (c) explained above, one can form the inversion regions 115 with a width substantially identical with the width of the non-inversion regions 114 and further a with a semi-circular cross section when viewed in the Y-direction of the substrate 112c.

When such a structure is applied to the conversion of the laser beam having a wavelength of about 1 μm, it is necessary to provide the inversion regions 115 with a pitch of about 6 μm. This means that each inversion regions 115 should have a width of about 3 μm. When the width is about 3 μm, the depth of the regions 115 formed in accordance with the process of FIGS. 4(A)–4(C) has a depth of about 1.5 μm in correspondence to one-quarter of the pitch. In view of the depth of 2 μm of the optical waveguide 113, the inversion regions 115 do not reach the bottom of the optical wave guide 113, and the SHG device fabricated according to the process of FIGS. 4(A)–4(C) cannot meet the demand of efficient conversion of the fundamental optical beam. This problem of insufficient depth of the regions 115 becomes particularly acute when the SHG device is used in combination with a laser diode that produces an output optical beam with a reduced wavelength such as 0.85 μm. In such a case, the desired pitch of the inversion regions 115 for the wavelength conversion is about 3–4 μm. This means that one can form the inversion regions 115 only with a depth of less than 1 μm. Thereby, the SHG device is no longer effective in conversion of the fundamental optical beam to the second order optical beam.

In the fourth process (d) for forming the inversion regions 115 by the electron beam, one can achieve a sufficient depth for the regions 115. On the other hand, such a process for writing the pattern in correspondence to the inversion regions 115 by the focused electron beam requires a long processing time and is disadvantageous from the view point of mass producing the SHG device.

SUMMARY OF THE INVENTION

Accordingly, it is a general object of the present invention to provide a novel and useful process for fabricating an SHG device for converting an input optical beam of a fundamental wavelength into an output optical beam of higher order harmonic wavelength, wherein the foregoing problems are eliminated.

Another and more specific object of the present invention is to provide a process for fabricating an SHG device wherein a periodically repeated regions of inverted polarization is grown from a surface into the interior of a ferroelectric crystal with sufficient depth while suppressing a lateral growth of such a regions.

Another object of the present invention is to provide a process for forming an inversion regions having a first polarization in a ferroelectric substrate that has a second, opposite polarization, comprising the steps of: applying a proton exchange process for exchanging cations in said ferroelectric substrate with protons selectively in correspondence to a regions in which said inversion regions is to be formed; providing electrodes on upper and lower major surfaces of said ferroelectric substrate; and growing said inversion regions selectively in a direction vertical to said upper major surface of the ferroelectric substrate by applying a d.c. voltage across the electrode on the upper major surface of the ferroelectric substrate and the electrode on the lower major surface of the ferroelectric substrate to induce an electric field acting in a direction coincident to a direction of said first polarization in said ferroelectric substrate. According to the present invention, the protons that are introduced at the upper major surface of the substrate migrate toward the lower major surface of the substrate as a result of the electric field and the inversion regions grows selectively in the direction perpendicular to the upper major surface of the substrate. On the other hand, the lateral growth of the inversion regions is effectively eliminated. By using the process of the present invention, it is possible to form the SHG device that converts the fundamental mode optical beam into the second harmonic mode optical beam with improved efficiency of conversion, by forming the inversion regions in the optical waveguide such that the inversion regions reaches the bottom of the optical waveguide.

Another object of the present invention is to provide a process for forming an inversion regions having a first polarization in a ferroelectric substrate that has a second, opposite polarization, comprising the steps of: providing upper and lower electrodes respectively on upper and lower major surfaces of a ferroelectric substrate; patterning the upper electrode such that a plurality of electrode fingers forming a first electrode group are formed on the upper major surface of the substrate in correspondence to a regions in which said inversion regions is to be formed and such that a plurality of electrode fingers forming a second electrode group are formed such that each of said electrode fingers forming said second electrode group are formed adjacent to but in separation from said electrode fingers that form the first electrode group; causing an inversion of polarization in said ferroelectric substrate in correspondence to said regions wherein said electrode fingers that form said first group electrode are provided; said step of causing the inversion comprising: a step of applying a first voltage to the electrode fingers that forms the first electrode group and a step of applying a second voltage to the electrode finger that forms the second electrode group, such that said first voltage has a magnitude larger than a magnitude of said second voltage, said magnitude of said first voltage being set sufficient to cause the inversion of polarization in the ferroelectric substrate, while said magnitude of said second voltage being set not to cause the inversion of polarization in the ferroelectric substrate. According to the present invention, the voltage level of the substrate located under the electrode patterns that form the second electrode group is held at a level such that there occurs no inversion of polarization under such a regions when the first voltage is applied to the electrode patterns for causing the inversion of polarization. Thereby, the lateral growth of the inversion regions is prohibited and the inversion regions grows selectively in the direction perpendicular to the upper major surface of the substrate. Thereby, the depth of the inversion regions increases substantially. When the process of the present invention is applied for the fabrication of the SHG device, one can increase the efficiency of conversion of the wavelength substantially.

Another object of the present invention is to provide a process for forming an inversion regions having a first polarization in a ferroelectric substrate that has a second, opposite polarization, comprising the steps of: providing upper and lower electrodes respectively on upper and lower major surfaces of a ferroelectric substrate; patterning the upper electrode such that a plurality of electrode patterns are left on the upper major surface of the substrate in correspondence to a regions in which said inversion regions is to be formed; and causing an inversion of polarization in said ferroelectric substrate in correspondence to said regions wherein said electrode patterns are provided by applying a voltage to the electrode fingers on the upper major surface of the substrate; wherein said step of applying the voltage is achieved in a reduced pressure environment. According to the present invention, one can cause the desired inversion of polarization selectively in said regions where the inversion is to be formed, without causing a leak of current to adjacent regions by eliminating impurities. Thereby, unwanted inversion of polarization occurring in the regions outside the regions in which the inversion should occur, is positively eliminated.

Another object of the present invention is to provide a process for forming an inversion regions having a first polarization in a ferroelectric substrate that has a second, opposite polarization, comprising the steps of: providing upper and lower electrodes respectively on upper and lower major surfaces of a ferroelectric substrate; patterning the upper electrode such that a plurality of electrode fingers are formed on the upper major surface of the substrate in correspondence to a regions in which said inversion regions is to be formed; providing an insulation layer on said upper major surface of said substrate such that said insulation layer covers at least those parts of the upper major surface of the substrate that are exposed between the electrode fingers of said electrode pattern; and causing an inversion of polarization in said ferroelectric substrate in correspondence to said regions wherein said electrode fingers are provided by applying a voltage to the electrode fingers. According to the present invention, one can cause the desired inversion of polarization selectively in said regions where the inversion is to be formed, without causing a leak of current to adjacent regions by protecting the surface of the ferroelectric substrate by the insulation layer. Thereby, unwanted inversion of polarization occurring in the regions outside the regions in which the inversion should occur, is positively eliminated.

Another object of the present invention is to provide a process for forming an inversion regions having a first polarization in a ferroelectric substrate that has a second, opposite polarization, comprising the steps of: providing upper and lower electrodes respectively on upper and lower major surfaces of a ferroelectric substrate; patterning the upper electrode such that a plurality of electrode fingers are formed on the upper major surface of the substrate in correspondence to a regions in which said inversion regions is to be formed; modifying said electrode finger on said upper major surface of said substrate to form a buffer structure for eliminating an electric discharge occurring at the electrode fingers; and causing an inversion of polarization in said ferroelectric substrate in correspondence to said regions wherein said electrode patterns are provided by applying a voltage to the electrode fingers on the upper major surface of the substrate. According to the present invention, one can eliminate successfully the problem of the electrode patterns being damaged by the electric discharge occurring at the edge part of the electrode pattern by isolating or eliminating the edge part of the electrode patterns from the essential part thereof.

Another object of the present invention is to provide a process for forming an inversion regions having a first polarization in a ferroelectric substrate that has a second, opposite polarization, comprising the steps of: providing upper and lower electrodes respectively on upper and lower major surfaces of a ferroelectric substrate: patterning the upper electrode such that a plurality of electrode fingers are formed on the upper major surface of the substrate in correspondence to a regions in which said inversion regions is to be formed; and causing an inversion of polarization in said ferroelectric substrate in correspondence to said regions wherein said electrode fingers are provided by irradiating said electrode patterns by a charged particle beam. According to the present invention, one can induce the desired inversion of the polarization by charging the electrode patterns electrostatically.

Another object of the present invention is to provide a process for forming an inversion regions having a first polarization in a ferroelectric substrate that has a second, opposite polarization, comprising the steps of: providing upper and lower electrodes respectively on upper and lower major surfaces of a ferroelectric substrate; patterning the upper electrode such that a plurality of finger patterns are formed on the upper major surface of the substrate to extend parallel with each other in correspondence to a regions in which said inversion regions is to be formed, said step of patterning being conducted such that said finger patterns have an elongate rectangular shape extending with a size of less than 50 μm in an elongating direction; and causing an inversion of polarization in said ferroelectric substrate in correspondence to said regions wherein said finger patterns are provided by applying a predetermined voltage across the electrode provided on the upper major surface of the substrate and the lower major surface of the substrate. According to the present invention, one can obtain a straight edge in the rectangular inversion regions that is formed in correspondence to the rectangular electrode pattern by setting the size of the electrode pattern to be less than 50 μm in the elongating direction. Thereby, one can maximize the efficiency of conversion when the ferroelectric substrate formed with the inversion regions as such is used for an SHG device.

Other objects and further features of the present invention will become apparent from the following detailed description when read in conjunction with the attached drawings.

BRIEF DESCRIPTION OF THE DRAWINGS

FIGS. 1(A) and 1(B) disclose conventional SHG devices for converting an input optical beam of the fundamental mode to an optical beam of the second-harmonic mode;

DETAILED DESCRIPTION OF PREFERRED EMBODIMENTS

Figure 2A:
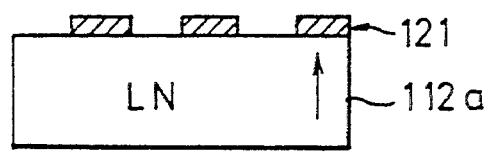
FIGS. 2(A) and 2(B) are diagrams showing a conventional process for fabricating an SHG device.
Figure 2B:
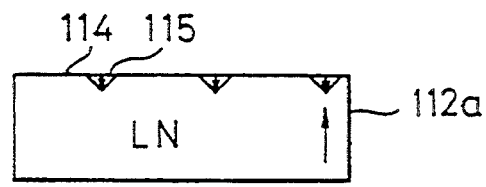
Figure 3A:
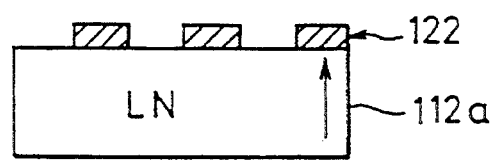
FIGS. 3(A) and 3(B) are diagrams showing another conventional process for fabricating an SHG device.
Figure 3B:
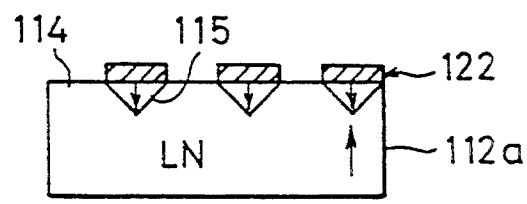
Figure 4A:
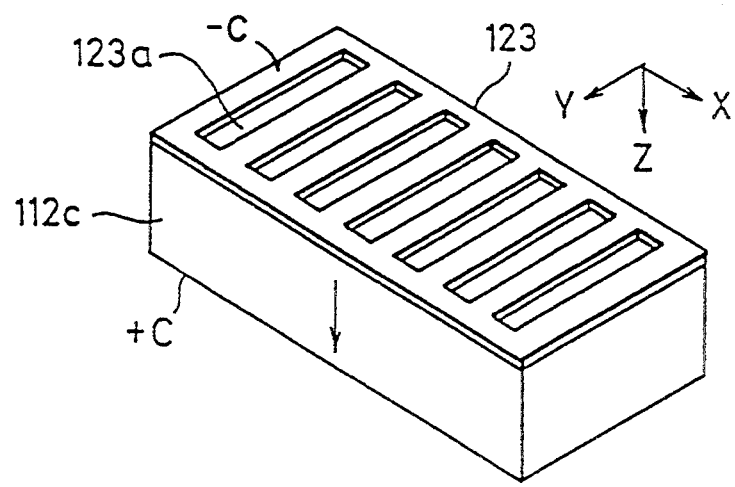
FIGS. 4(A)–4(B) are diagrams showing still another conventional process for fabricating an SHG device.
Figure 4B:
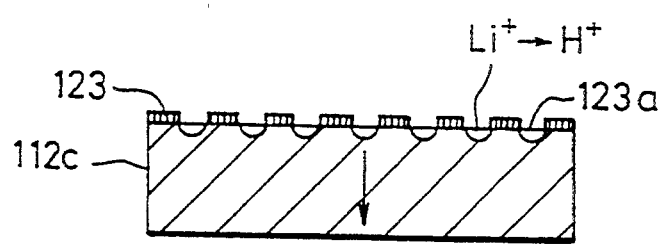
Figure 4C:
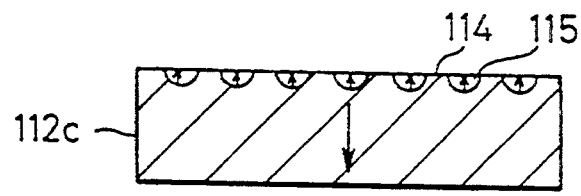

Next, a first embodiment of the present invention will be described with reference to FIGS. 5(A)–5(E), wherein these drawings show the process for forming an inversion regions wherein the polarization is inverted selectively in a ferroelectric substrate. In the drawings, the surface designated as +C indicates the surface of the substrate to which the polarization vector of the substrate is pointed, while the surface designated as −C indicates the surface that opposes the +C surface.

Figure 5A:
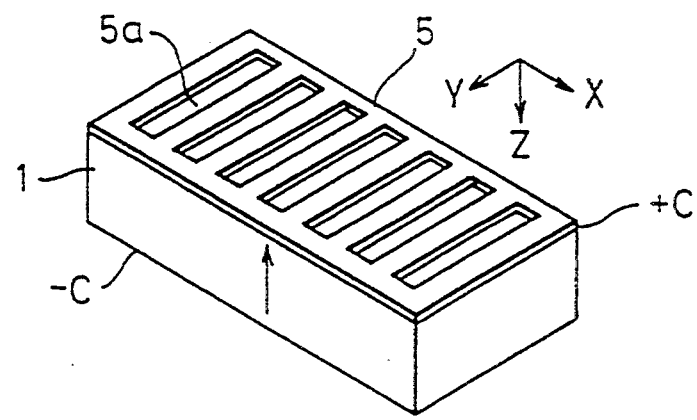
FIGS. 5(A)–5(B) are diagrams showing a process for fabricating an SHG device according to a first embodiment of the present invention.

Referring to FIG. 5(A) showing the process for forming the mask on a surface of a ferroelectric substrate 1 having an elongated rectangular shape, a Z-cut crystal of $LiTaO_3$ having a thickness of about 500 μm is used for the substrate 1 with a polarizing process applied such that there is formed a uniform polarization in the substrate 1 with a direction as indicated by an arrow. In the substrate 1 cut with such an orientation, the Z-axis extends perpendicularly to the upper and lower major surfaces of the substrate 1 with a direction opposite to the polarization vector indicated by the arrow, while the Y-axis extends in the lateral direction on the surface of the substrate. Further, the X-axis extends in the longitudinal direction also along the upper major surface of the substrate.

There, the +C surface of the substrate 1 (upper major surface in the present case) is subjected to an optical grade polishing and a Ta layer 5 is deposited thereon by a vacuum deposition process. Further, the Ta layer 5 is patterned such that there are formed a plurality of openings 5a in correspondence to where the inversion regions are to be formed. There, each opening 5a has an elongated rectangular form extending in the Y-direction of the substrate 1.

Figure 5B:
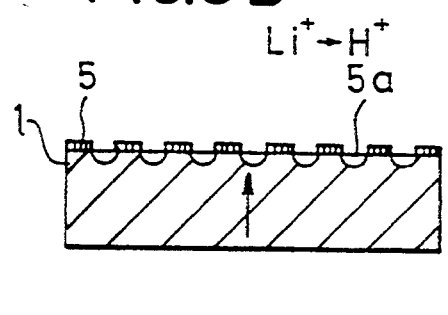

The substrate 1 thus formed with the mask 5 is then subjected to a proton exchange process shown in FIG. 5(B) wherein the structure of FIG. 5(A) is immersed in a solution of pyrophosphoric acid held at 250° C. for about 30 minutes. As a result of the reaction with the pyrophosphoric acid, the composition of the substrate 1 is modified in correspondence to each part that is exposed by the window 5a of the mask 5 such as a regions 4 that is laterally surrounded by a region 3 where no such modification of composition occurs. In each region 4, the Li+ ions in the substrate 1 are replaced by protons H+ 4.

Figure 5C:
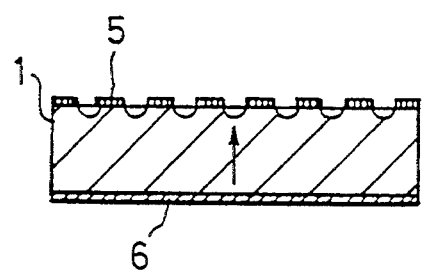
Figure 5D:
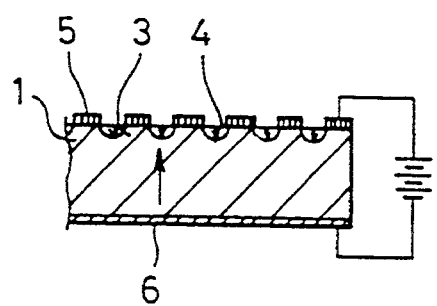

Next, an opposing electrode 6 of Ta is provided on the −C surface of the substrate 1 as shown in FIG. 5(C), and a voltage is applied as indicated in FIG. 5(D) across the mask 5 and the electrode 6 with a direction set to cause an inversion of the polarization. In the illustrated example, the positive voltage is applied to the +C surface via the mask 5, while a negative voltage is applied to the −C surface via the electrode 6. The magnitude of the voltage changes depending on the thickness of the substrate 1 and is typically set to a value such that an electric field of about 200 kV/cm is induced in the substrate 1. Upon the application of the voltage as such, the protons introduced at the region 4 migrate into the interior of the substrate 1 due to the acceleration by the electric field thus induced. Thereby, the protons move in a substantially straight path toward the −C surface and the inversion regions 4 grows selectively in the vertical direction to the surface of the substrate, without causing a lateral growth into the adjacent regions 3 of the original polarization, as illustrated in FIG. 5(E).

According to the present embodiment, the polarization of the substrate 1 is inverted by applying an electric field opposing the polarization formed in the substrate 1. Further, the same electric field facilitates the migration of the protons thus introduced to the interior of the substrate along the electric flux associated with the electric field, and the inversion of the polarization proceeds progressively toward the interior of the substrate 1. Thereby, one can achieve a depth for the region 4 such that the depth exceeds a few microns. By applying the process of the present embodiment for the formation of the inversion regions 115 of the SHG device, one can increase the efficiency of wavelength conversion significantly.

Figure 5E:
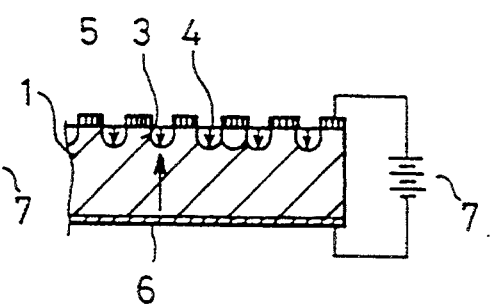

In the process of FIGS. 5(D) and 5(E), one may heat the substrate 1 to a temperature of about 200° C. for facilitating the migration of the protons. Further, one may change the voltage applied across the mask 5 and the electrode 6 during the process of FIGS. 5(D) and 5(E) for preventing the lateral spreading of the inversion regions 4. In the present embodiment, it should be noted that the voltage is not applied directly to the region 4 but to the region 3 located between two adjacent regions 4. There, the protons in the region 4 experience the acceleration by the electric field induced at the adjacent regions.

Next, a second embodiment of the present invention will be described with reference to FIGS. 6(A)–6(I).

Figure 6A:
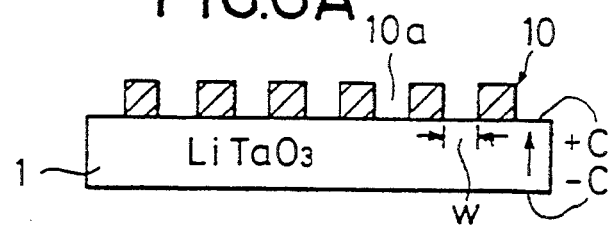
FIGS. 6(A)–6(I) are diagrams showing the process for fabricating an SHG device according to a second embodiment of the present invention.
Figure 6B:
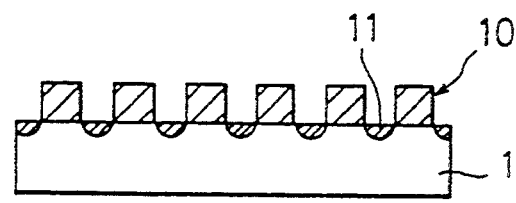

Referring to FIG. 6(A) at first, a mask 10 of Ta is deposited on the +C surface of the LiTaO₃ substrate 1 and patterned subsequently to form a mask pattern having a window 10a such that the window 10a has a width w of 1.0 gm and is repeated with a pitch of 3.4 μm. Next, the structure of FIG. 10(A) is immersed in a solution of pyrophosphoric acid held at 255° C. for about 20 minutes to produce a proton exchange process. As a result of the proton exchange process, a proton exchange region 11 is formed as shown in FIG. 6(B) in correspondence to each window 10a wherein the Li+ ions are exchanged with protons H+. In such a proton exchange region 11, the threshold voltage for the inversion of polarization is decreased. Thus, each region 11 is used as a nuclei for growing the region of inverted polarization by the application of voltage as will be described later.

Figure 6C:
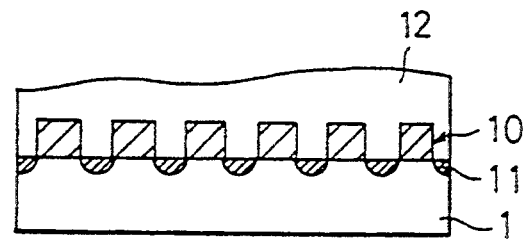

Next, a resist 12 is applied on the mask 10 thus patterned as shown in FIG. 6(C), and the mask 10 is exposed from the side of the +C surface in accordance with an exposure pattern that corresponds to the mask pattern of the mask 10. After the development, one obtains a structure as shown in FIG. 6(D) wherein the exposed resist pattern 12 remains on the mask pattern 10.

Figure 6D:
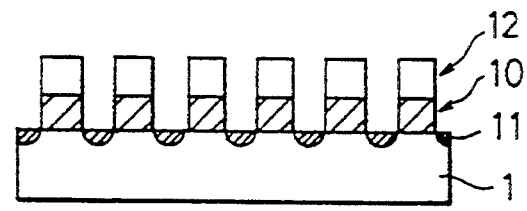
Figure 6E:
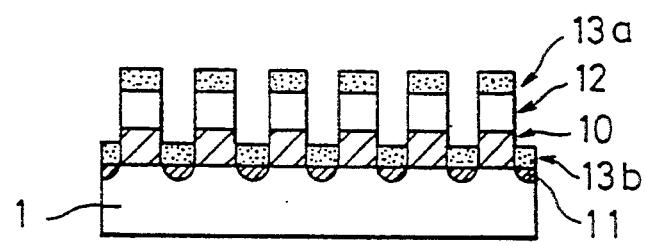
Figure 6F:
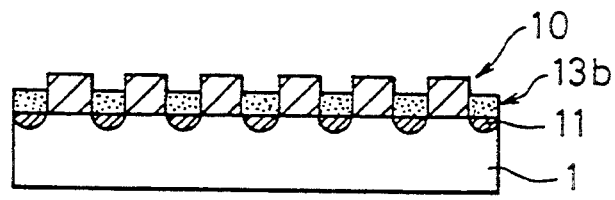
Figure 6G:
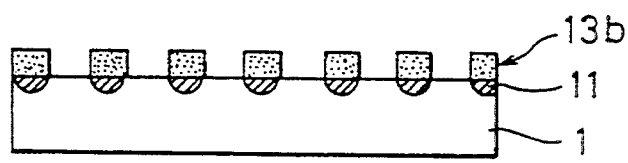
Figure 6H:
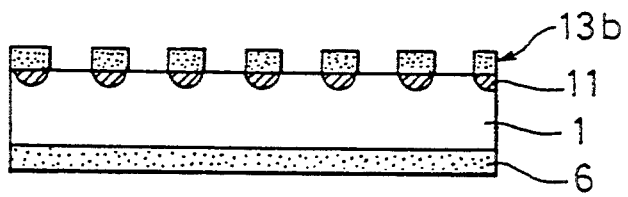

Further, a metal layer of Ti is deposited on the structure of FIG. 6(D) such that a Ti layer 13a covers the resist pattern 12 and such that a Ti layer 13b covers the exposed surface of the substrate 1 in correspondence to each region 11. After removing the resist pattern 12 together with the Ti pattern 13a thereon by dissolving the resist pattern 12 in acetone or other suitable solvent, one obtains the structure shown in FIG. 6(F). Next, an RIE process is applied, by using a mixture of CF₄ and O₂ as the etching gas, to the structure of FIG. 6(F) to remove the Ta mask pattern 10 selectively against, relatively to the Ti pattern 13b. Thereby, a structure shown in FIG. 6(G) is obtained such that the Ti pattern is left selectively on the proton exchange region 11.

Figure 6I:
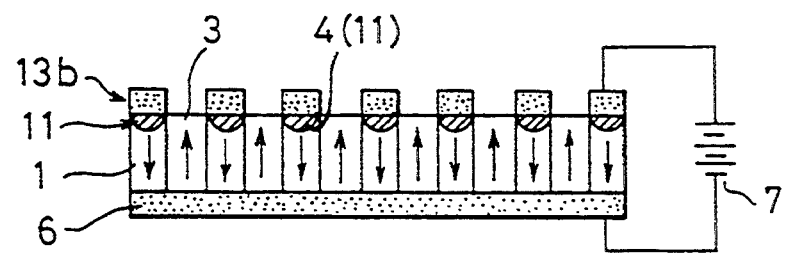

Further, another electrode layer 6 is deposited on the −C surface of the substrate 1, and a voltage is applied across the Ti pattern 13b on the +C surface and the electrode layer 6 on the −C surface by a d.c. voltage source 7 as shown in FIG. 6(I). Again, the voltage is set such that an electric field of about 200 kV/cm appears in the ferroelectric substrate 1. Thereby, there occurs the desired inversion of polarization in each proton exchange region 11, and the inversion of polarization thus induced propagates toward each −C surface with the migration of the protons from the region 11 as a result of acceleration by the electric field. Thereby, one can obtain the inversion regions 4 that extend as much as several ten microns in the vertical direction of the substrate 1.

By removing the Ti electrode pattern 13b in the structure of FIG. 6(I) and forming a waveguide region along the +C surface of the substrate 1, one can construct an efficient SHG device. As the inversion region formed according to the process of the present embodiment reaches a depth of several ten microns, there is no particular need for forming a very shallow waveguide region. Thereby, the present embodiment is advantageous for facilitating the fabrication of the SHG devices.

In the process described in the second embodiment, there can occur a case wherein a current leaks along the surface of the substrate when a high voltage is applied in the step of FIG. 6(I), particularly when the thickness of the substrate 1 is large. When such a leak of current occurs, the +C surface of the substrate 1 may be charged up in correspondence to the region 3 located between the inversion region 4(11) due to the electric charges migrating from the electrode 13b, and such a charge-up can cause an unwanted inversion of polarization in correspondence to the region 3 where no inversion of polarization should occur.

Hereinafter, a third embodiment for eliminating this problem will be described with reference to FIG. 7(A) and 7(B).

Figure 7A:
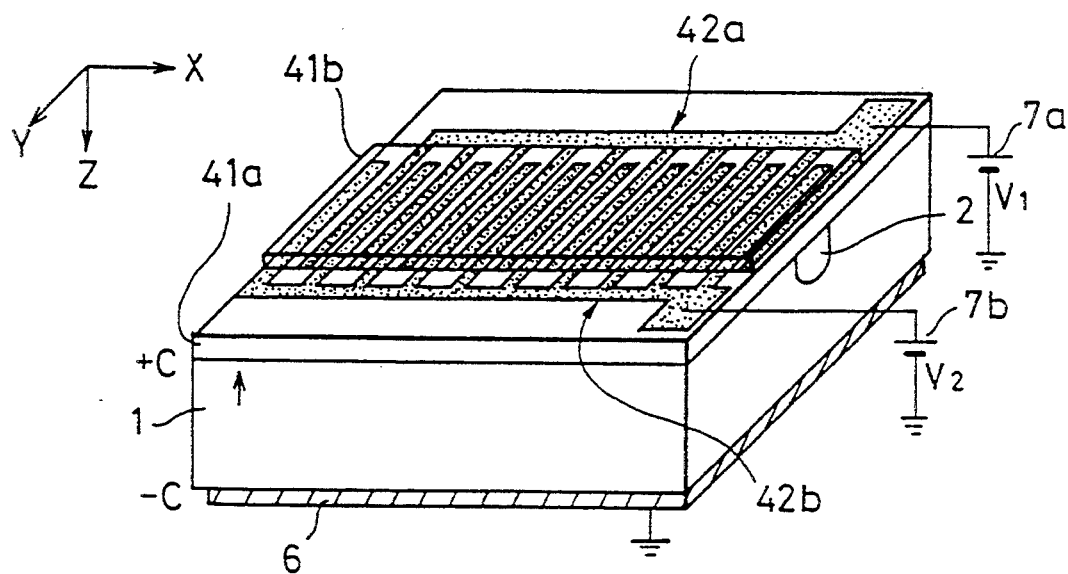
FIGS. 7(A) and 7(B) are diagrams showing the process for fabricating an SHG device according to a third embodiment of the present invention.
Figure 7B:
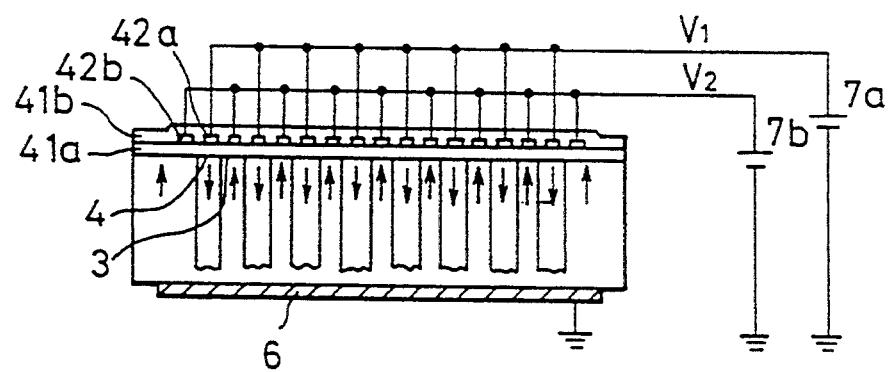

Referring to FIG. 7(A), a Ta mask is provided on the +C surface of the LiTaO$_3$ substrate 1 in a thickness of about 1000 Å and patterned subsequently to form a mask pattern that has an openings extending in the elongated (i.e., longitudinal) direction of the substrate 1, of a width of about 2 μm. A similar mask 22 is shown in the embodiment of FIG. 9(B) to be described later. There, the mask 22 is formed with an opening 22a that extends in the longitudinal (X) direction of the substrate 1.

The substrate 1 thus covered by the mask is immersed in a solution of pyrophosphoric acid held at 250° C. for about 30 minutes to conduct a proton exchange process in correspondence to each part that is exposed by the opening. Thereby, an optical waveguide 2 enriched in protons is formed in the LiTaO$_3$ substrate 1 to, extending in the longitudinal direction of the substrate 1 as indicated in FIG. 7(A). After the formation of the optical waveguide 2, the mask is removed and the substrate 1 annealed in the air at 360° C. for about 2 hours for reducing the loss in the optical waveguide and for recovering the non-linear optical constants.

After the processing of the substrate 1 as such, a transparent layer 41a of insulating material such as silicon oxide is deposited on the substrate 1 to cover the +C surface, and interdigital electrode patterns 42a and 42b of titanium are provided on the silicon oxide layer 41a. There, each of the interdigital electrodes 42a and 42b has a number of finger electrodes extending in a direction transverse to the elongated (i.e., longitudinal) direction of the optical waveguide 2, and the fingers of the electrode 42a and the fingers of the electrode 42b are repeated alternately in the direction of the optical waveguide 2. Typically, the finger electrodes may have a width of 0.7 μm and repeat with a pitch of 3.4 μm. Further, in order to eliminate the electric discharge between adjacent fingers, a silicon oxide layer 41b is deposited to bury the finger electrodes underneath. In addition, an electrode 6 is provided to cover the −C surface of the substrate 1, and the electrode 6 thus provided is connected to the ground. There, it should be noted that the fingers for the electrode 42a are formed in correspondence to the part wherein the inversion of polarization is to be caused in the substrate.

In the process for causing the inversion, a first d.c. voltage source 7a is used to apply a first voltage $V_1$ to each of the finger electrodes of the electrode 42a, while a second d.c. voltage source 7b is connected to the electrode 42b for supplying a second voltage $V_2$ to each of the finger electrodes of the electrode. 42b. There, the first voltage $V_1$ is set larger than the second voltage $V_2$ ($V_1 > V_2$) such that any electric charges migrating on the +C surface of the substrate 1 from the electrode 42a are absorbed by the second voltage source 7b via the electrode 42b. Typically, the first voltage $V_1$ is set to induce an electric field of about 210 kV/cm in the substrate 1, while the second voltage $V_2$ is set to induce an electric field of about 200 kV/cm in the substrate 1, which is smaller than the threshold for causing the inversion of polarization in the LiTaO$_3$ substrate 1. Of course, it is preferable to increase the difference between the first voltage $V_1$ and the second voltage $V_2$ within the range that there occurs no damage in the finger electrodes due to the electric discharge or breakdown of the insulation layer 41b.

By applying the voltages $V_1$ and $V_2$ as set forth above, it was found that the inversion region 4 can be formed with the depth of several ten microns from the +C surface of the substrate 1. By setting the longitudinal length of the optical waveguide 2 to be 10 mm, it was demonstrated that the SHG device thus formed provides a blue optical beam with the wavelength of 420 nm at the output end of the optical waveguide 2, when an optical beam having a wavelength of 840 nm is injected at the input end of the optical waveguide 2.

Figure 8:
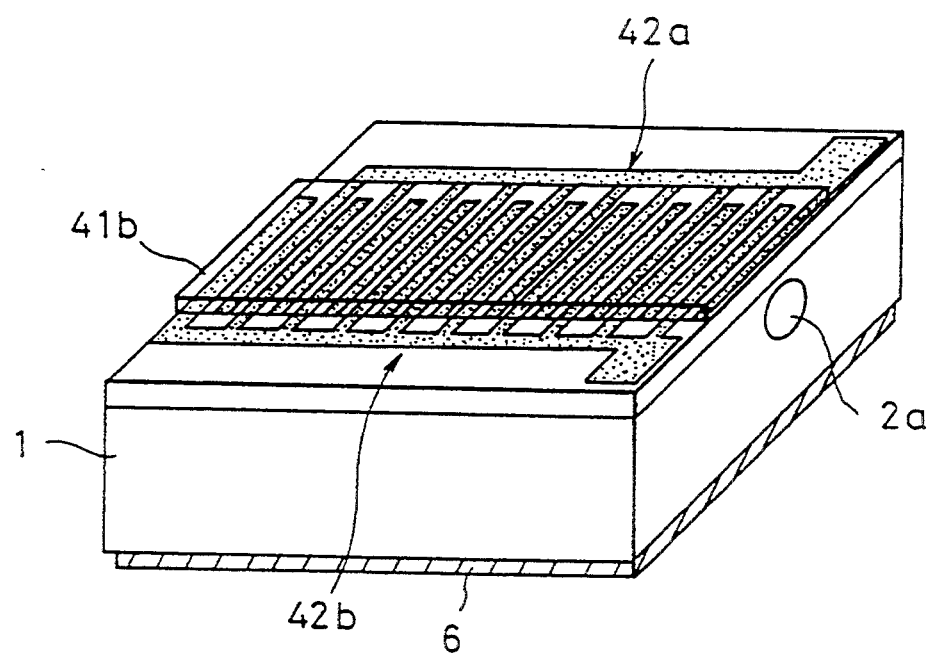
FIG. 8 is a diagram showing a modification of the process of the third embodiment.

FIG. 8 shows a modification of the SHG device according to the third embodiment of the present invention, wherein there is provided an embedded optical waveguide region 2a such that the region 2a extends in the longitudinal direction of the substrate 1 at a level below the +C surface. By burying the optical waveguide 2a as such, one can avoid various problems of optical loss that may be caused for example by the finger electrodes of the electrodes 42a and 42b. In the SHG device fabricated according to the process described above, it is possible to form the inversion regions 4 to extend deeply into the substrate 1, and a strong interaction between the optical beam and the inversion regions 4 is guaranteed even when the optical waveguide 2a is formed below the +C surface of the substrate 1.

Next, a fourth embodiment of the present invention will be described with reference to FIGS. 9(A) and 9(B).

Figure 9A:
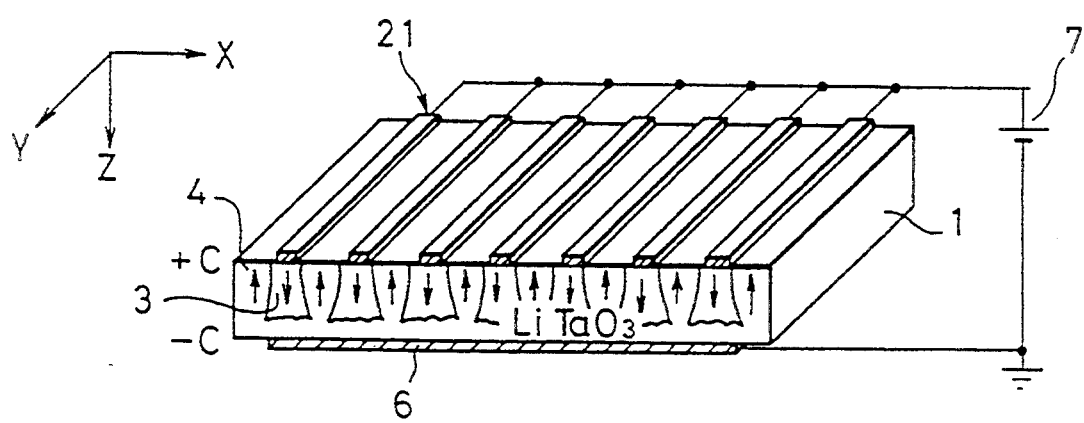
FIGS. 9(A) and 9(B) are diagrams showing the process for fabricating an SHG device according to a fourth embodiment of the present invention.
Figure 9B:
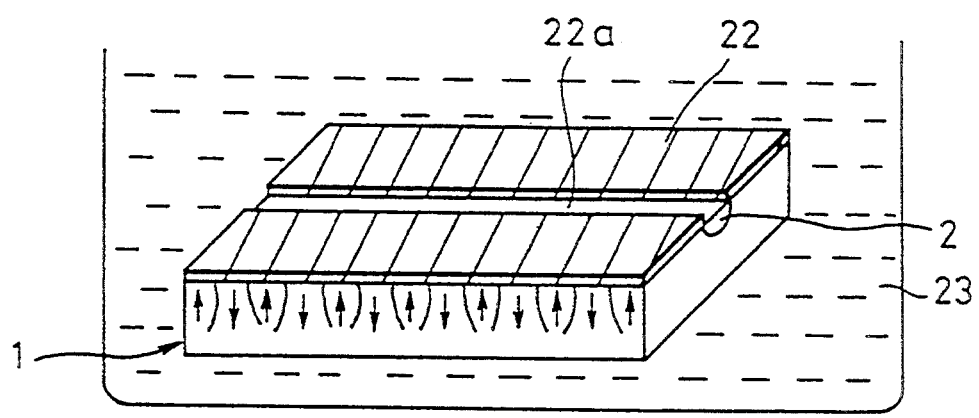

Referring to FIG. 9(A), a Ti layer is deposited on the +C surface of the LiTaO$_3$ substrate 1 in a thickness of about 1000 Å, and the Ti layer thus deposited is patterned subsequently to form a number of elongated electrode patterns 21 each having a width of 1 μm and extending in the transverse direction or Y-direction of the substrate 1 such that the electrode patterns are repeated in the elongated direction or X-direction of the substrate 1 with a pitch of 3.4 μm. Further, the rear side electrode 6 is provided to cover the −C surface.

Further, the LiTaO$_3$ substrate 1 thus formed is placed in an evacuated chamber, and a positive voltage is applied across the electrode pattern 21 by the d.c. voltage source 7 for a duration of about 1 minute with a magnitude such that there is established an electric field in the substrate 1 with the field strength of 210 kV/cm. As the device is held in the vacuum environment, the migration of electric charges via impurities on the substrate surface is effectively eliminated. Thereby, the inversion region 4 is formed in correspondence to the electrode patterns 21 with a depth of several ten microns. In the process of applying the electric field, the magnitude and duration of the voltage may be adjusted such that the inversion region 4 and the non-inversion region 3 are repeated with the same width or size when measured in the X-direction of the substrate 1. Further, one may apply the electric field in the form of a voltage pulse with the peak field strength of about 400 kV/cm and pulse width of 10 msec for avoiding the problem of electric discharge. In this case, the voltage pulse may be repeated for about 10 seconds with a frequency of 1 Hz.

After the inversion region 4 is formed as such, the electrodes are removed from the structure of FIG. 9(A) and a Ta mask layer is deposited on the +C surface of the substrate 1 to form a mask 22. See FIG. 9(B). Further, the mask 22 is patterned to form an opening 22a extending in the X-direction with a width of about 2 μm such that the opening 22a exposes the +C surface. Further, the substrate 1 thus covered by the mask 22 is dipped in a solution of pyrophosphoric acid 23 held at 250° C. as shown in FIG. 9(B) for about 30 minutes for forming the optical waveguide 2 in correspondence to the exposed part as a result of the proton exchange.

Next, the mask 22 is removed and the substrate is annealed for reducing the loss in the optical waveguide and for restoring the non-linear optical property. The SHG device thus formed with the length of 10 mm in the X-direction produced a blue optical beam having a wavelength of 420 nm in response to the injection of an optical beam having a wavelength of 840 nm. In the process of the present embodiment, it is of course possible to form the optical waveguide 2 before the regions 4 are formed.

Figure 10:
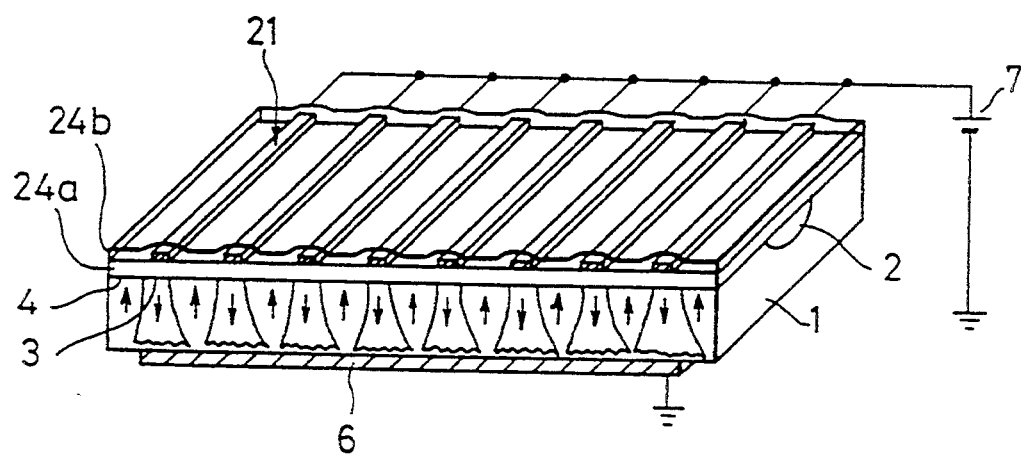
FIG. 10 is a diagram showing a modification of the fourth embodiment.
Figure 11:
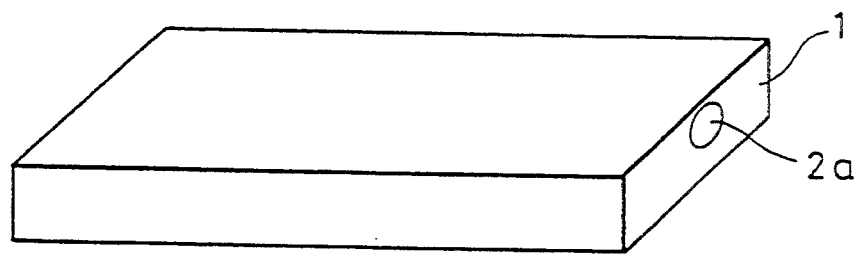
FIG. 11 is a diagram showing another modification of the fourth embodiment.

FIG. 10 shows a modification of the fourth embodiment, wherein there is provided a mask pattern of Ta on the +C surface of the LiTaO$_3$ substrate 1 similarly to the mask 22 of FIG. 9(B), and the optical waveguide 2 is formed similarly to the previous embodiment. After the optical waveguide 2 is formed, an insulation layer 24a of silicon oxide is deposited to cover the +C surface of the substrate 1, and the electrode patterns 21 are formed on the silicon oxide layer 24a. Further, the electrode patterns 21 thus formed are buried under an insulation layer 24b of silicon oxide that typically has a thickness of about several thousand angstroms. The inversion of polarization is caused by applying a voltage across the electrode pattern 21 and the electrode 6 by the d.c. voltage source 7 similarly to the foregoing embodiment. In the present embodiment that uses the insulation layers 24a and 24b for burying the electrode pattern 21, the inversion process can be achieved in the atmospheric environment, without being affected by the surface impurities of the LiTaO$_3$ substrate 1. In the present embodiment, the insulation layer 24a provided between the optical waveguide 2 and the electrode patterns 21 acts to eliminate the optical absorption by the electrode patterns 21. When the optical waveguide 2 is provided under the +C surface in the embedded state as shown in FIG. 11, the layer 24a may be omitted.

Next, a fifth embodiment of the present invention will be described with reference to FIGS. 12(A)–12(E), wherein in the step of FIG. 12(A), a Ti electrode 51 is deposited on the +C surface of the substrate 1 of LiTaO$_3$ or LiNbO$_3$. Further, the electrode 6 is deposited on the −C surface of the substrate 1. Next, the electrode 51 is patterned into a number of strip-like electrode patterns 51a such that the electrode patterns 51a are repeated in the X-direction with a pitch of 3.4 μm as shown in FIG. 12(B). Further, as shown in FIG. 12(C), each strip-like electrode pattern 51a is segmented into a central part 51a$_1$, and lateral parts 51a$_2$, 51a$_3$ by providing grooves 52' and 52" extending in the X-direction, such that the grooves 52' and 52" separates the central part 51a$_1$ from the respective lateral parts 51a$_2$, 51a$_3$.

There, the groove 52 is formed to cut into the +C surface of the substrate 1 and isolates the lateral parts 51a$_2$ and 51a$_3$ from the central part 51a$_1$ of the electrode pattern 51a electrically.

Figure 12A:
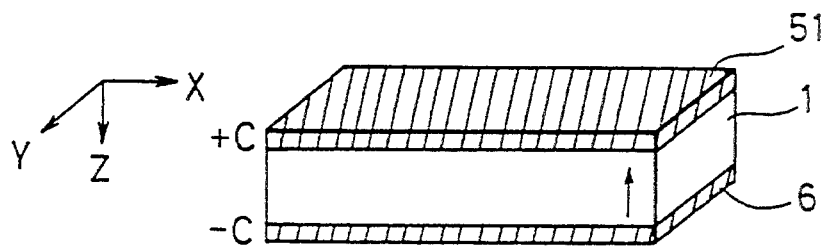
FIGS. 12(A)–12(E) are diagrams showing the process for fabricating an SHG device according to a fifth embodiment of the present invention.
Figure 12B:
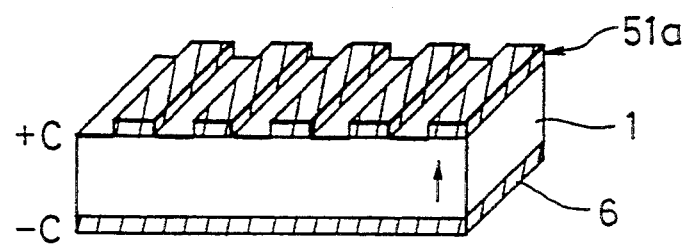
Figure 12C:
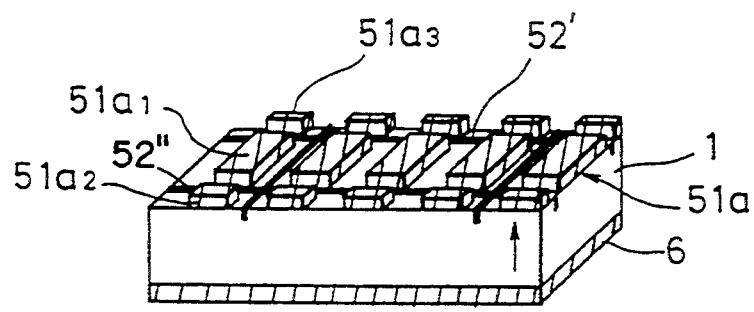
Figure 12D:
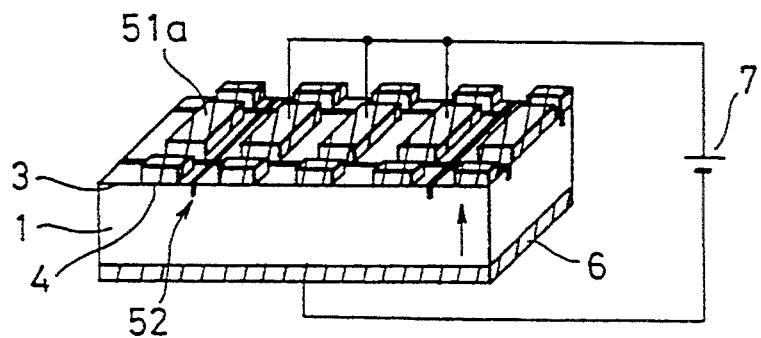
Figure 12E:
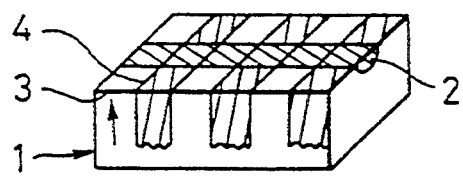

In the step of FIG. 12(D), the d.c. voltage source 7 is activated to apply the voltage across the central part 51a$_1$ of the electrode pattern 51a and the rear side electrode 6 to induce the inversion of polarization in the substrate 1 in correspondence to each electrode 51a$_1$. Similarly to the previous case, an electric field of about 210 kV/cm is induced in the substrate 1 by the d.c. voltage source 7. Thereby, the inversion regions 4 grow in the direction perpendicular to the +C surface of the substrate 1 as indicated in FIG. 12(E). Further, the optical waveguide 2 is formed as indicated in FIG. 12(E).

There, the leak of current occurring along the side wall of the substrate 1 is substantially reduced by isolating the edge parts 51a$_2$, 51a$_3$ of the electrode pattern 51a from the essential part 51a$_1$ by providing the grooves 51' and 52", and because of this, one can apply a large voltage exceeding 10.5 kV, for example, across the electrode pattern 51a$_1$ and the rear side electrode 6 in the atmospheric environment, without causing an electric discharge. It should be noted that the foregoing voltage of 10.5 kV provides the electric field strength of 210 kV/cm in the LiTaO$_3$ substrate having a thickness of 0.5 mm. The grooves 52' and 52" provide an excellent isolation particularly when the substrate 1 is heated to remove any moisture from the surface thereof.

Figure 13A:
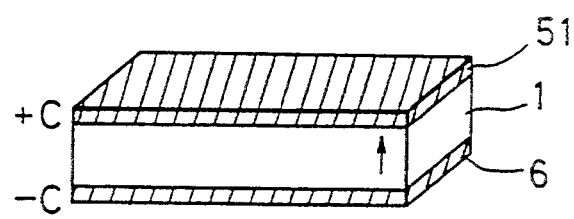
FIGS. 13(A)–13(E) are diagrams showing a modification of the fifth embodiment.
Figure 13B:
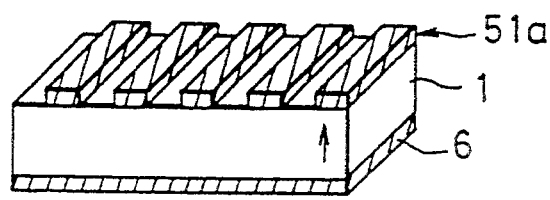

FIGS. 13(A)–13(E) exhibit modification of the process of the fifth embodiment, wherein the steps of FIGS. 13(A) and 13(B) are identical with the steps of FIGS. 12(A) and 12(B).

Figure 13C:
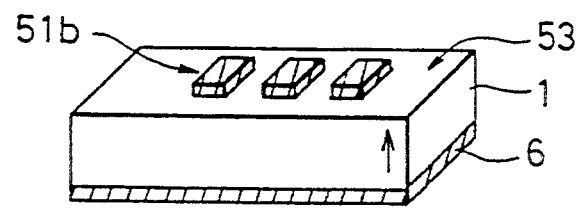

In the present embodiment, the electrode patterns 51a are further patterned in the step of FIG. 13(C) to form electrode patterns 51b, such that the edge part corresponding to the parts 51a$_2$, 51a$_3$ of FIG. 12C are removed. Thereby, the +C surface of the substrate 1 is exposed around the electrode patterns 51b.

Figure 13D:
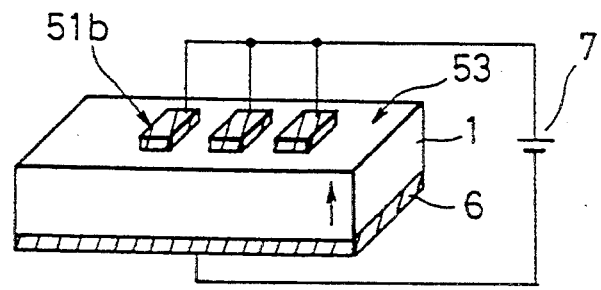
Figure 13E:
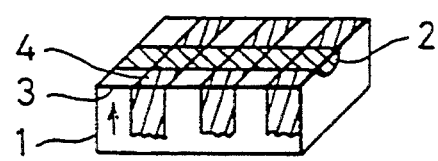

Next, in the step of FIG. 13(D), the d.c. voltage source 7 is employed to apply the voltage across the electrode patterns 51b and the rear side electrode 6 to induce the inversion of polarization, as indicated in FIG. 13(E). In the present embodiment, too, one can eliminate the problem of current leak occurring at side wall of the substrate 1.

Figure 14A:
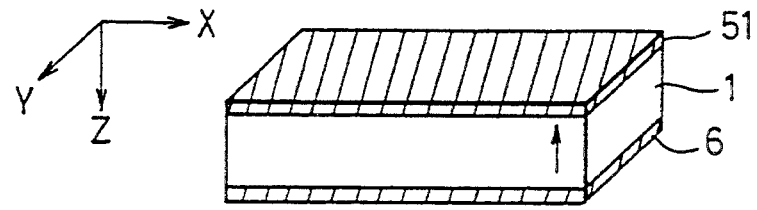
FIGS. 14(A)–14(D) are diagrams showing the process for fabricating an SHG device according to a sixth embodiment of the present invention.
Figure 14B:
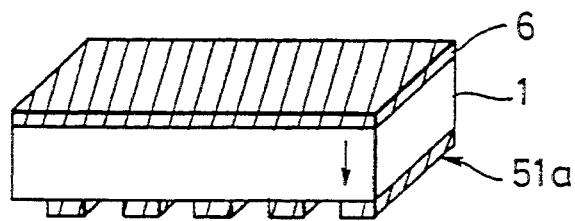

Next, a sixth embodiment of the present invention will be described with reference to FIGS. 14(A)–14(D), wherein the electrodes 6 and 51 are provided respectively on the +C and −C surfaces of the substrate 1, and the electrode 51 is subjected to a patterning process to form electrode patterns 51a as shown in FIG. 14(B).

Figure 14C:
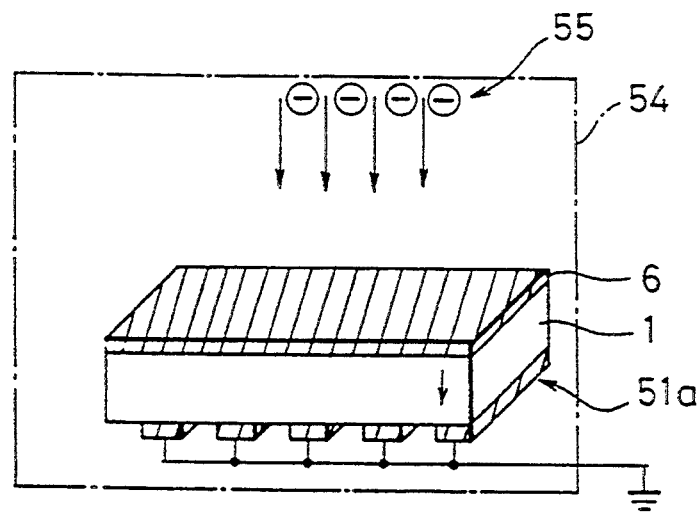
Figure 14D:
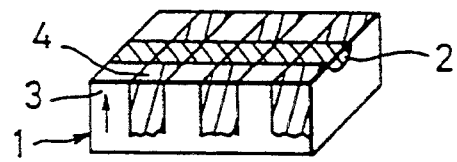

There, the structure of FIG. 14(B) is incorporated into a vacuum chamber and the electrode patterns 51a are connected to the ground as shown in FIG. 14(C). In this state, an electron beam 55 is irradiated on the rear side electrode 6 to cause a charge-up of the electrode 6 as indicated in FIG. 14(C). Thereby, a voltage is applied across the electrode pattern 51a and the rear side electrode 6 and the desired inversion of polarization is induced as indicated in FIG. 14(D).

Next, a seventh embodiment of the present invention will be described with reference to FIG. 15.

Figure 15:
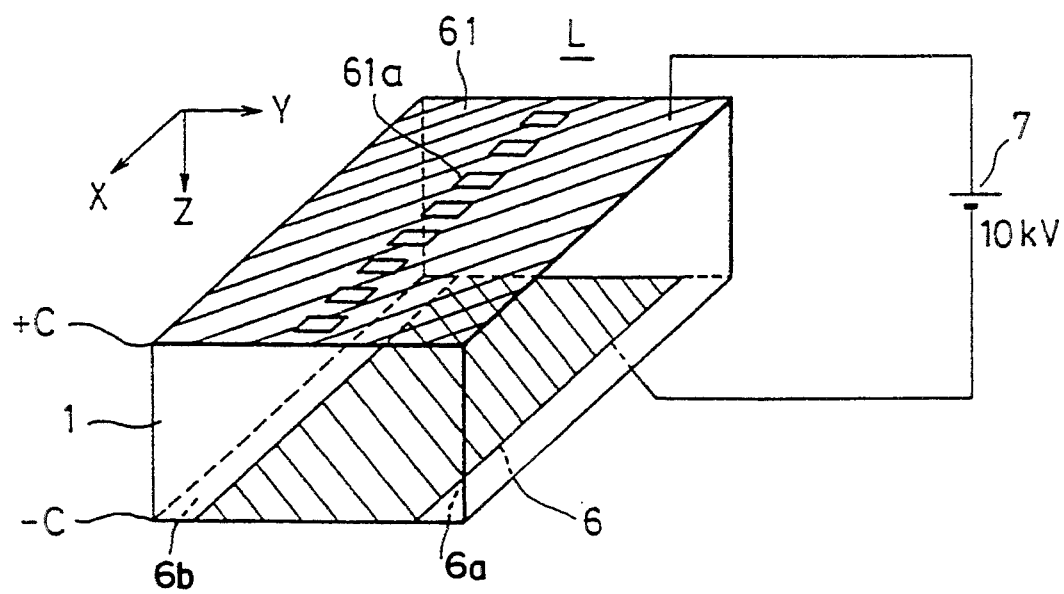
FIG. 15 is a diagram showing the process for fabricating an SHG device according to a seventh embodiment of the present invention.

Referring to FIG. 15, there is provided a Ti electrode layer 61 on the +C surface of the LiTaO$_3$ substrate 1. Further, the substrate 1 has the rear side electrode 6 at the −C surface of the substrate 1 similarly to the previous embodiments. Further, the electrode layer 61 is patterned to form a number of elongated rectangular openings 61a each extending in the Y-direction such that in parallel relationship and a row of the parallel rectangular openings 61a extends in The X-direction. In the seventh embodiment shown in FIG. 15, the structure may have a thickness in the Z-direction of 0.5 mm.

In the present embodiment, the d.c. voltage source 7 is employed to apply the voltage across the electrode 61 and the electrode 6 to induce the inversion of polarization in the substrate except for those parts corresponding to the openings 61a. There, rectangular regions are formed in the substrate 1 in correspondence to the openings 61a wherein the direction of polarization is inverted with respect to the regions that surrounds the rectangular regions. By forming the optical waveguide to extend in the X-direction to cross the rectangular region, one obtains the SHG device that produces the second-harmonic optical beam as a result of the enhanced interaction between the fundamental optical beam and the periodically repeated rectangular region.

In such an SHG device, it is essential that of the rectangular regions formed in correspondence to the openings 61a has a flat, well defined front and rear edges for efficient wavelength conversion. On the other hand, it was observed that there occurs an undulation in the front and rear edges in the rectangular region, particularly when the size of the rectangular region in the elongated direction and hence the size L of the opening 61a is large.

Figure 16:
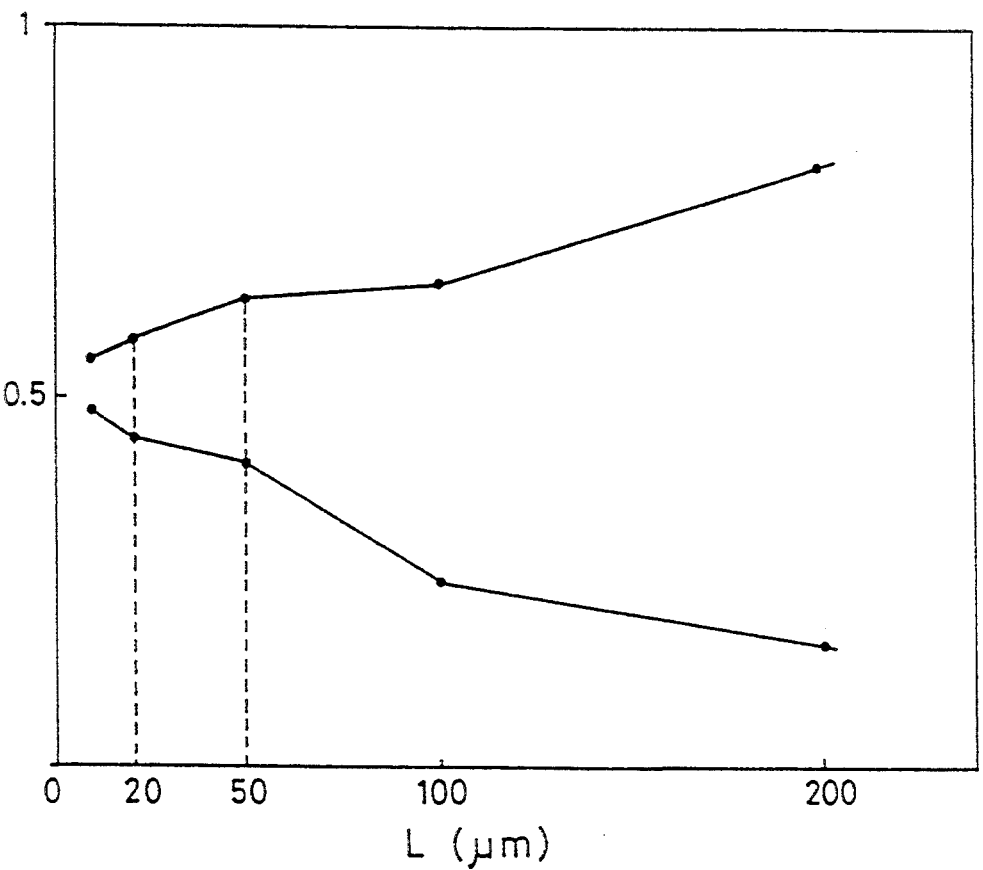
FIG. 16 is a diagram showing the effect achieved by the seventh embodiment.

FIG. 16 shows the relationship that was discovered by the inventors of the present invention, wherein the vertical axis represents the amplitude of undulation occurring in the front and rear edges of the rectangular region as represented in terms of the ratio of the polarity inversion, while the horizontal axis represents the elongate size L of the rectangular opening 61a. At the edge of the region of polarity inversion, the value of the ratio becomes 0.5, while when there exists an undulation at the edge, the ratio may fluctuate above and below 0.5.

From FIG. 16 it will be noted that the amplitude of undulation becomes excessively large when the size L of the mask opening 61a has increased beyond 50 $\mu$m. The result of FIG. 16 indicates the preferable range of the size L for the opening 61a of less than 50 $\mu$m. Particularly, a better result is obtained when the size L is set to be less than 20 $\mu$m. The same argument holds true also in the case wherein the pattern of the electrode 61 is inverted such that electrode strips are formed in correspondence to the openings 61a.

In FIG. 15 it will be noted that the electrode 6 at the lower major surface of the substrate 1 is patterned such that both lateral edge parts 6a and 6b are removed. Thereby, one can eliminate the problem of electric discharge occurring at the side wall of the substrate 1 between the upper and lower electrodes.

Figure 17:
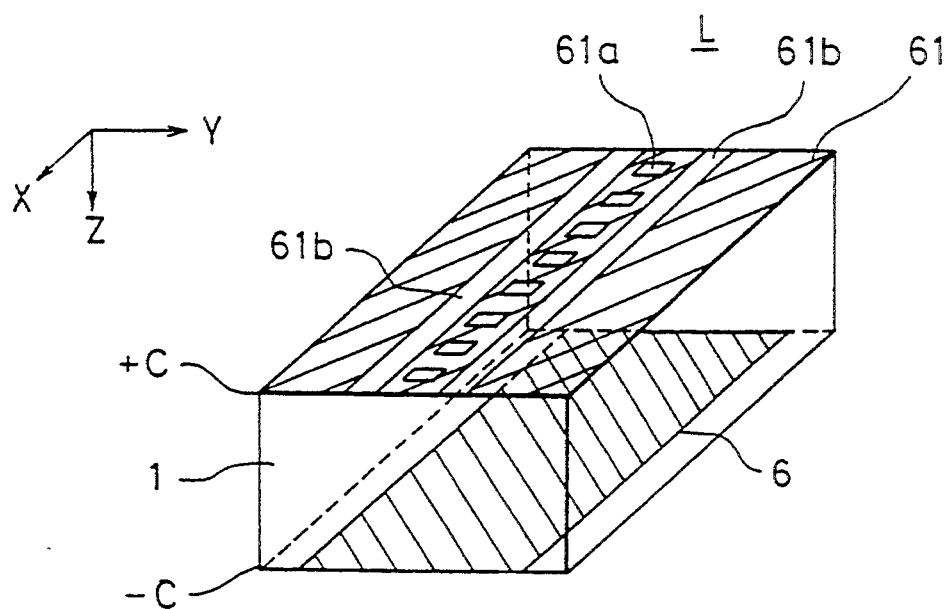
FIG. 17 is a diagram showing a modification of the seventh embodiment.

FIG. 17 shows a modification of the seventh embodiment, wherein there are provided elongated cutouts 61b to extending in the X-direction at both opposite sides of the openings 61a. According to the construction of the present embodiment, it is possible to increase the concentration of electric field at the longitudinal ends of the elongated rectangular region, and a well defined rectangular pattern is obtained for the rectangular regions.

Figure 18:
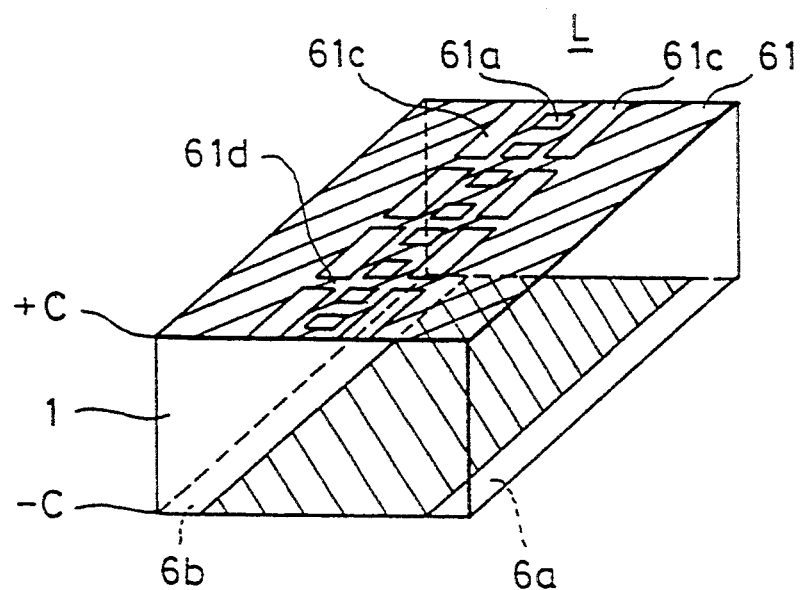
FIG. 18 is a diagram showing another modification of the seventh embodiment.

FIG. 18 shows another modification of the seventh embodiment for increasing the concentration of the electric field at the opposite longitudinal edge parts of the rectangular region and simultaneously for avoiding a discharge that tends to occur in the structure of FIG. 17 in correspondence to the region where the surface of the substrate is exposed at the cutout 61b of FIG. 17. In the present modification, the continuous cutout 61b of FIG. 17 is replaced by separate, smaller cutouts 61c that are separated from each other by a conducting bridge part 61d. Thereby, the electric discharge at the cutout 61c is successfully eliminated. Further the supply of electric charges to the electrode part that defines the openings 61a is guaranteed. In the modified embodiments of FIGS. 17 and 18, the structures may have an overall thickness in the Z-direction of 0.5 mm.

In the seventh embodiment, one may combine various features of the previous embodiments to maximize the effect of the present invention. For example, one may form the isolation structure such as the grooves 52' and 52" of FIG. 12(C) or the exposed surface 53 of FIG. 13(C) in the embodiment of FIG. 17 and conduct the application of the d.c. voltage in the evacuated environment as described with reference to FIG. 9(A).

Further, the present invention is not limited to the embodiments described heretofore, but various variations and modifications may be made without departing from the scope of the invention.

What is claimed is:

1. A method for forming an inversion region having a first direction of polarization in a ferroelectric substrate that has a second, opposite direction of polarization, said substrate having upper and lower surfaces disposed generally perpendicularly of said polarization directions, said method comprising:

exchanging protons for cations at a locality adjacent to said upper major surface in said ferroelectric substrate to thereby produce a proton rich zone at said locality, said locality being selectively positioned in correspondence to the intended position of said inversion region;

providing respective electrodes on said upper and lower surfaces of the substrate; and creating said inversion region by applying a d.c. voltage across said electrodes so as to induce an electric field in the substrate acting in the direction of said first direction of polarization to thereby cause protons to migrate from said proton rich zone selectively in a direction perpendicular to said upper surface.

2. A method as set forth in claim 1, wherein said step of exchanging protons comprises masking said upper surface of the substrate so as to expose said locality thereof and immersing the masked substrate in a medium that causes an exchange of protons for cations in said ferroelectric substrate.

3. A method as set forth in claim 1, wherein said d.c. voltage has a magnitude sufficient to cause an inversion of the direction of polarization in said substrate from said second polarization direction to said first polarization direction.

4. A method as set forth in claim 3, wherein said substrate is heated during the application of said voltage.

5. A method as set forth in claim 3, wherein said voltage is changed as a function of time during the proton migration.

6. A method as set forth in claim 2, wherein said electrode of the upper surface is patterned so as to function as a mask for said masking step.

7. A method for forming an inversion region having a first direction of polarization in a ferroelectric substrate that has a second, opposite direction of polarization, comprising the steps of:

providing upper and lower electrodes respectively on upper and lower major surfaces of a ferroelectric substrate;

patterning the upper electrode such that a plurality of electrode fingers forming a first electrode group are formed on the upper major surface of the substrate in correspondence to a region in which said inversion region is to be formed and such that a plurality of electrode fingers forming a second electrode group are formed adjacent to but separated from said electrode fingers of the first electrode group;

causing an inversion of polarization in said ferroelectric substrate in correspondence to said region wherein said electrode fingers that form said first group electrode are provided;

said step of causing the inversion comprising: applying a first voltage to the electrode fingers that form the first electrode group and applying a second voltage to the electrode fingers that form the second electrode group, said first voltage having a magnitude larger than the magnitude of said second voltage, said magnitude of said first voltage being selected to be of a magnitude sufficient to cause the inversion of polarization in the ferroelectric substrate and said magnitude of said second voltage being selected so as not to cause the inversion of polarization in the ferroelectric substrate.

8. A method as claimed in claim 7 further comprising patterning the upper electrode such that said electrode fingers forming the first electrode group and said electrode fingers forming the second electrode group extend in parallel with each other and repeat alternately in a direction perpendicular to a direction in which each of said electrode fingers extend.

9. A method for forming inversion regions having a first direction of polarization in a ferroelectric substrate that has a second, opposite direction of polarization, comprising the steps of:

providing upper and lower electrodes respectively on upper and lower major surfaces of a ferroelectric substrate;

patterning the upper electrode to form a plurality of spaced electrode fingers on the upper major surface of the substrate in correspondence to portions of said substrate in which said inversion regions are to be formed; and causing an inversion of polarization in said ferroelectric substrate in correspondence to said inversion regions by applying a voltage to the electrode fingers on the upper major surface of the substrate in a reduced pressure environment.

10. A method for forming inversion regions having a first direction of polarization in a ferroelectric substrate that has a second, opposite direction of polarization, comprising the steps of:

providing upper and lower electrodes respectively on upper and lower major surfaces of a ferroelectric substrate;

patterning the upper electrode so as to form a plurality of spaced electrode fingers on the upper major surface of the substrate having spacings therebetween in correspondence to, and exposing therethrough, respective portions of said substrate in which said inversion region are to be formed;

providing an insulation layer on said upper major surface of said substrate such that said insulation layer covers at least those portions of the upper major surface of the substrate that are exposed through the spacings between the electrode fingers of said electrode pattern; and causing an inversion of polarization in said portions of said ferroelectric substrate which are in correspondence to said inversion regions by applying a voltage to the electrode fingers.

11. A method for forming an inversion region having a first direction of polarization in a ferroelectric substrate that has a second, opposite direction of polarization comprising the steps of:

providing a first insulation layer covering an upper major surface of the ferroelectric substrate;

providing an upper electrode on said first insulation layer;

providing a lower electrode on a lower major surface of the ferroelectric substrate;

patterning the upper electrode so as to form a plurality of spaced electrode fingers on the upper major surface of the substrate having spacings therebetween in correspondence to, and exposing therethrough, respective portions of said substrate in which said inversion regions are to be formed;

providing a second insulation layer on said first insulation layer covering at least those portions of the upper major surface of the ferroelectric substrate that are exposed through the spacings between the electrode fingers of said electrode pattern; and causing an inversion of polarization in said portions of said ferroelectric substrate which are in correspondence to said inversion regions by applying a voltage to the electrode fingers.

12. A method for forming an inversion region having a first direction of polarization in a ferroelectric substrate that has a second, opposite direction of polarization, comprising the steps of:

providing upper and lower electrodes respectively on upper and lower major surfaces of a ferroelectric substrate;

patterning the upper electrode so as to form a plurality of spaced electrode fingers on the upper major surface of the substrate having spacings therebetween in correspondence to, and exposing therethrough, respective portions of said substrate in which said inversion region are to be formed;

modifying said electrode fingers so as to form a buffer structure for reducing the likelihood of electrical discharges occurring between the electrode fingers; and causing an inversion of polarization in said portions of said ferroelectric substrate which are in correspondence to said inversion regions by applying a voltage to the electrode fingers on the upper major surface of the substrate.

13. A method as claimed in claim 12 in which said step of forming the buffer structure further comprises forming a pair of spaced, longitudinally extending grooves in the upper major surface of the ferroelectric substrate separating opposite lateral end parts of each from a central part thereof.

14. A method as claimed in claim 12 in which said step of forming the buffer structure further comprises the step of removing, from each of the electrode fingers, the opposite, lateral end parts of each electrode finger.

15. A method for forming inversion regions having a first polarization in a ferroelectric substrate that has a second, opposite polarization, comprising the steps of:

providing upper and lower electrodes respectively on upper and lower major surfaces of ferroelectric substrate;

patterning said upper electrode to form a plurality of electrode fingers on the upper major surface of the substrate, extending in a first direction in parallel and spaced relationship with each other and aligned in a row extending in a second direction transverse to the first direction, in correspondence to inversion regions to be formed in said substrate, and such that said finger patterns have an elongated rectangular shape and a size of less than 50 $\mu$m in the first direction thereof; and causing an inversion of polarization in said ferroelectric substrate in correspondence to said inversion regions by applying a predetermined voltage across said upper electrode and said lower electrode.

16. A method as claimed in claim 15 in which said step of patterning comprises a step of forming the finger patterns with a size of less than 20 $\mu$m in the first direction.

17. A method as claimed in claim 16 in which said step of forming the finger patterns further comprises: forming a plurality of finger-shaped openings in said upper electrode between, and defining, said electrode fingers and such that each of said finger-shaped openings extends in the first direction and said plurality of finger-shaped openings and finger electrodes are arranged in alternating relationship and in alignment in a row extending in the second direction; and forming a pair of further, elongated openings in said upper electrode extending in parallel with each other in the second direction and respectively spaced from the opposite sides of said row.

18. A method for forming an inversion region having a first direction of polarization in a ferroelectric substrate that has a second, opposite direction of polarization, comprising the steps of:

providing upper and lower electrodes respectively on upper and lower major surfaces of a ferroelectric substrate;

patterning said upper electrode to form a plurality of electrode fingers on the upper major surface of the substrate, extending in a first direction in parallel and spaced relationship with each other and aligned in a row extending in a second direction transverse to the first direction, in correspondence to inversion rgions to be formed in said substrate and such that said finger patterns have an elongated rectangular shape and a size of less than 50 $\mu$m in the first direction, said step of forming the finger electrodes further comprising the steps of: forming a plurality of finger-shaped openings in said upper electrode between, and defining, said electrode fingers and such that each of said finger-shaped openings extends in the first direction and said plurality of finger-shaped openings and finger electrodes are arranged in alternating relationship and in alignment in a row extending in the second direction; and forming a pair of further, elongated openings in said upper electrode extending in parallel with each other in the second direction and respectively spaced from the opposite sides of said row; and causing an inversion of polarization in said ferroelectric substrate in correspondence to said inversion regions by applying a predetermined voltage across the upper electrode and said lower electrode;

said step of patterning further comprising forming a structure for avoiding electrical discharges between said upper and lower electrodes; and said step of applying the predetermined voltage further comprising applying the predetermined voltage in a reduced pressure environment for avoiding the occurrence of electric discharges between said upper and lower electrodes.

19. A method as claimed in claim 18 further comprising patterning said lower electrode such that said lower electrode extends in the second direction and is defined by a pair of lateral, parallel edges also extending in the second direction and spaced apart by a distance, measured in the first direction perpendicular to said second direction of said row, which is less than the dimension of the substrate in the first direction and such that corresponding lateral edge portions of said lower major surface of said substrate are exposed and afford said structure for avoiding electrical discharges.

* * * * *

UNITED STATES PATENT AND TRADEMARK OFFICE
CERTIFICATE OF CORRECTION

PATENT NO. : 5,380,410  Page 1 of 6
DATED : January 10, 1995
INVENTOR(S) : IPPEI SAWAKI et al.

It is certified that error appears in the above-indentified patent and that said Letters Patent is hereby corrected as shown below:

Column 1, line 27, before "desired" insert --a--.
Column 2, line 41, delete ":" and substitute --;--;
 line 61, delete "regions 115 are" and substitute --region 115 is--.
Column 3, line 19, after "because" insert --of--;
 line 24, after "115" insert --.--;
 line 35, delete "regions" and substitute --region--;
 line 50, delete "+C";
 line 54, after "i.e." insert --,--;
 line 58, after "formed" insert --,--;
 line 60, delete "elongate".
Column 4, line 20, delete "regions" and substitute --region--;
 line 21, delete "regions" and substitute --region--;
 line 22, delete "a" (first occurrence);
 line 28, delete "regions" and substitute --region--;
 line 29, delete "regions" and substitute --region--;
 line 34, delete "wave guide" and substitute --waveguide--.

UNITED STATES PATENT AND TRADEMARK OFFICE
CERTIFICATE OF CORRECTION

PATENT NO. : 5,380,410
DATED : January 10, 1995
INVENTOR(S) : IPPEI SAWAKI et al.

It is certified that error appears in the above-indentified patent and that said Letters Patent is hereby corrected as shown below:

```
Column 5, line 2, delete "a" (first occurrence); and delete
          regions" and substitute region--;
          line 4, delete "regions" and substitute --region--;
          line 9, delete "regions" and substitute --region--;
          line 10, delete "regions" and substitute --region--;
          line 12, delete "regions" and substitute --region--;
          line 32, delete "regions" and substitute --region--;
          line 33, delete "regions" and substitute --region--;
          line 36, delete "regions" and substitute --region--;
          line 44, delete "regions" and substitute --region--;
          line 45, delete "regions" and substitute --region--;
          line 52, delete "regions" and substitute --region--;
          line 68, delete "regions" and substitute --region--.
Column 6, line 3, delete "regions" and substitute --region--
          (both occurrences);
          line 6, delete "regions" and substitute --region--;
          line 12, delete "regions" and substitute --region--;
          line 19, delete "regions" and substitute --region--;
```

UNITED STATES PATENT AND TRADEMARK OFFICE
CERTIFICATE OF CORRECTION

PATENT NO. : 5,380,410
DATED : January 10, 1995
INVENTOR(S) : IPPEI SAWAKI et al.

It is certified that error appears in the above-indentified patent and that said Letters Patent is hereby corrected as shown below:

line 20, delete "regions" and substitute --region--;
    line 22, delete "regions" and substitute --region--;
    line 28, delete "regions" and substitute --region--;
    line 32, delete "regions" and substitute --region-- (both occurrences);
    line 35, delete "regions" and substitute --region--;
    line 42, delete "regions" and substitute --region--;
    line 43, delete "regions" and substitute --region--;
    line 50, delete "regions" and substitute --region--;
    line 53, delete "regions" and substitute --region--;
    line 54, delete "regions" and substitute --region--;
    line 58, delete "regions" and substitute --region- (both occurrences);
    line 61, delete "regions" and substitute --region--;
    line 68, delete "regions" and substitute --region--.

UNITED STATES PATENT AND TRADEMARK OFFICE
CERTIFICATE OF CORRECTION

PATENT NO. : 5,380,410
DATED : January 10, 1995
INVENTOR(S) : IPPEI SAWAKI et al.

It is certified that error appears in the above-indentified patent and that said Letters Patent is hereby corrected as shown below:

```
Column 7,  line  1, delete "regions" and substitute --region--;
           line  6, delete "regions" and substitute --region--;
           line 16, delete "regions" and substitute --region--;
           line 21, delete ":" and substitute --;--;
           line 23, delete "regions" and substitute --region--;
           line 24, delete "regions" and substitute --region--;
           line 26, delete "regions" and substitute --region--;
           line 33, delete "regions" and substitute --region--;
           line 41, delete "regions" and substitute --region--;
           line 42, delete "regions" and substitute --region--;
           line 47, delete "regions" and substitute --region--;
           line 53, delete "regions" and substitute --region--;
           line 58, delete "regions" and substitute --region--.
Column 8,  line 50, delete "regions" and substitute --region--.
Column 9,  line 20, delete "regions" and substitute --region--;
           line 41, delete "regions" and substitute --region--;
           line 44, delete "regions" and substitute --region--;
           line 57, delete "regions" and substitute --region--;
           line 66, delete "regions" and substitute --region--.
```

UNITED STATES PATENT AND TRADEMARK OFFICE
CERTIFICATE OF CORRECTION

PATENT NO. : 5,380,410
DATED : January 10, 1995
INVENTOR(S) : IPPEI SAWAKI et al.

It is certified that error appears in the above-indentified patent and that said Letters Patent is hereby corrected as shown below:

Column 10, line 10, delete " gm" and substitute --$\mu$m--;
    line 41, delete "against";
    line 54, delete "each" and substitute --the--;
    line 55, delete "the" and substitute --each--;
    line 57, delete "the".
*Column 11, line 21, delete "an";
    line 32, delete "to";
    line 36, delete "the".
Column 13, line 67, delete "separates" and substitute --separate--.
Column 14, line 21, delete "51'" and substitute --52'--;
    line 31, delete "exhibit" and substitute --show a--.
Column 15, line 3, after "direction" insert --in parallel relationship and--;
    line 4, after "that" delete "in parallel relation and";
    line 5, delete "The" and substitute --the--;
    line 15, delete "regions" and substitute --region--;
    line 18, delete "region" and substitute --regions--;

UNITED STATES PATENT AND TRADEMARK OFFICE
CERTIFICATE OF CORRECTION

PATENT NO. : 5,380,410
DATED : January 10, 1995
INVENTOR(S) : IPPEI SAWAKI et al.

It is certified that error appears in the above-indentified patent and that said Letters Patent is hereby corrected as shown below:

```
        line 21, delete "region" and substitute --regions--;
        line 35, after "region" insert --,--;
        line 41, after "16" insert --,--;
        line 59, delete "to";
        line 63, delete "region" and substitute --regions--.
Column 17, line 68, delete "region" and substitute --regions--.
```

Signed and Sealed this

Eighteenth Day of April, 1995

Attest:

Attesting Officer

BRUCE LEHMAN

*Commissioner of Patents and Trademarks*